INVENTOR:
THOMAS C. MAPOTHER,
BY Robert J. Mooney
HIS ATTORNEY.

INVENTOR:
THOMAS C. MAPOTHER,
BY Robert J. Mooney
HIS ATTORNEY.

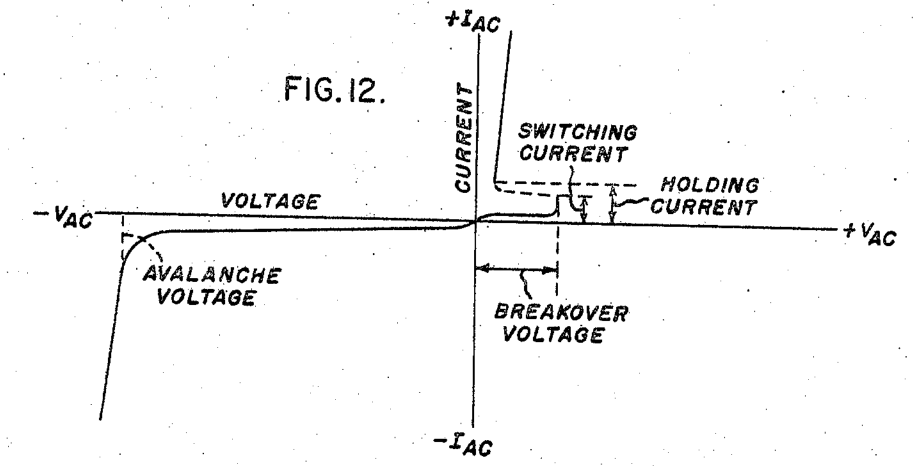
FIG.14.
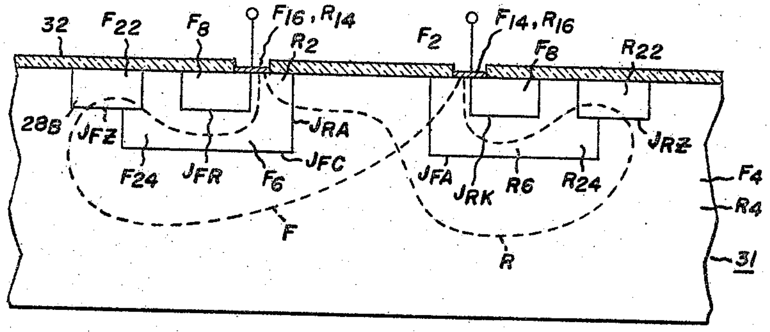
FIG. 13, FIG. 15
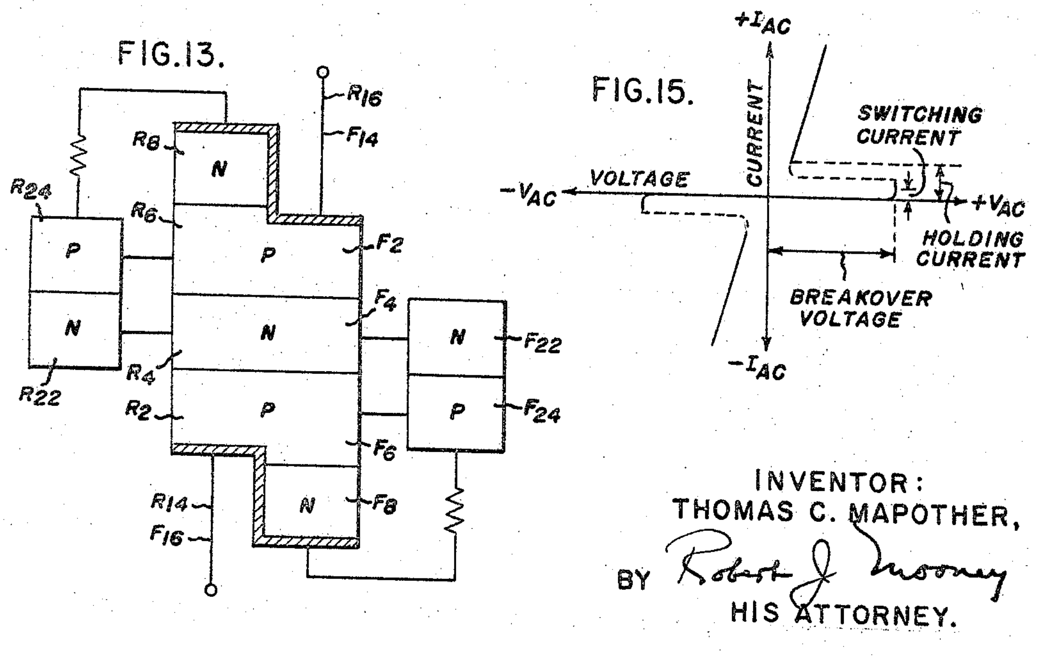
INVENTOR:
THOMAS C. MAPOTHER,
BY Robert J. Mooney
HIS ATTORNEY.

3,427,512

SEMICONDUCTOR LOW VOLTAGE SWITCH

Thomas C. Mapother, Liverpool, N.Y., assignor to General Electric Company, a corporation of New York Filed Nov. 26, 1965, Ser. No. 509,700
U.S. Cl. 317—235 13 Claims
Int. Cl. H01l 11/10

ABSTRACT OF THE DISCLOSURE

PNPN junction semiconductor devices of both unilateral and bilateral types are described which are switchable between high and low impedance states responsive to a predetermined magnitude of applied anode-cathode voltage, the low voltage magnitude required for switching being predetermined and extremely invariant with temperature. This switching characteristic is obtained by providing in parallel with the collecor junction of the NPN transistor analogue portion of the PNPN a control diode of temperature invariant breakdown voltage. A positive potential is applied to the anode terminal of the PNPN device thereby causing the emitter base junction of the PNP analogue portion of the device to become forward biased. The current then flows into the cathode region of the control diode. This causes the control junction to break down at the predetermined low voltage, permitting current flow to continue through the forward-biased emitter-base junction of the NPN transistor analogue portion of the device and to the cathode terminal, thereby switching the device to its low impedance state.

The present invention relates to improvements in semiconductor switching devices of the type which can be controllably switched between a state of high impedance and a state of low impedance, and more particularly to improvements in PNPN controlled switches of the junction semiconductor type.

Four-region three-junction semiconductor devices of the PNPN controlled switch or controlled rectifier type are known in the prior art. Basic operation of such devices has been described in such literature as, for example, chapter 1 of the General Electric Controlled Rectifier Manual, Second Edition, copyright 1961 by General Electric Company, chapter 19 of the General Electric Transistor Manual, sixth edition, copyright 1962 by General Electric Company, and in the article by R. A. Stasior in the magazine, "Electronics," for Jan. 10, 1964, pages 30 through 33. Although the basic operation of such devices is understood by those skilled in the art, a brief review of such operation in terms of the well-known two-transistor analogue may assist in a better understanding of the present invention. In interpreting the operation of the device in terms of its two-transistor analogue, the PNPN structure of such a device may be thought of as being equivalent to an NPN and a PNP transistor interconnected in a positive feedback configuration, that is, the collector current of one transistor is amplified by the other transistor and returned as the base drive for the one transistor. The specific characteristics of each junction can thus be interpreted in transistor terms, taking advantage of accepted theory developed for transistors. The four regions of the device may be conveniently referred to as the anode, anode gate, cathode gate, and cathode. The interface of the anode and anode gate region forms the anode junction, the interface of the anode gate and cathode gate regions forms the center or collector junction, and the interface of the cathode and cathode gate regions forms the cathode junction. In such a device wherein the anode region and cathode gate region are of P-type conductivity and the cathode region and anode gate region are of N-type conductivity, when the anode has a potential positive with respect to the cathode, the center junction is reverse biased. In this case it can be shown that anode-to-cathode current $I_{ac}$ is given by the formula $$\frac{I_{co}}{1-[(h_{fe_1})(h_{fe_2})]}$$

where $I_{co}$ is the leakage current of the center junction and $h_{fe_1}$ and $h_{fe_2}$ refer to the gain or beta (or common-emitter small signal short circuit forward current transfer ratio) of the NPN transistor portion and PNP transistor portion, respectively, into which the device may be resolved. When the product of the betas of the two transistors (or the sum of the grounded-base current gain alpha of each) is less than one, $I_{ac}$ is a relatively small current, consisting essentially of leakage current through the center junction, and hence the device is said to be in its "blocking" condition, presenting a high impedance to current flow from anode to cathode.

In the blocking condition of such a device, the feedback between the two transistors is insufficient for regeneration. Such devices are constructed so that the current gain of at least one of the two transistor sections into which the device is resolvable increases with current in the forward conduction direction, and so that the product of the betas (or the sum of the alphas) of the two transistor sections becomes equal to or greater than unity at some intermediate level of current through the center junction. When the product of the betas or sum of the alphas of the two transistors equals or exceeds unity, current regeneration occurs and the device switches to its "turned-ON" state, presenting a low impedance to current flow from anode to cathode.

One method of turning on such a device is to increase the current across the center junction $I_c$ by applying a "gate" signal in the form of a base current to either transistor. In this manner, the device may be turned on, or switched to its low impedance state, when the voltages across the various reverse biased junctions are all well below their respective breakdown values, but this switching method requires a third terminal to the device for application of the "gate" signal. It is also possible, even without a "gate" signal, to turn on the device by applying forward bias voltage only. Under these conditions, turning on of the device results when the breakdown voltage of the center junction is exceeded, and hence this method of switching has heretofore had the disadvantage that relatively high anode-to-cathode voltages, of at least 20 volts for example, have been required for turn-on in this manner. Once turned on, the PNPN device remains in the low impedance state, provided a minimum current, known as the "holding current," sufficient to maintain the product of the betas or sum of the alphas of the transistors equal to or greater than unity continues to flow through the device. To cause the device to turn off or revert to its high impedance or blocking condition, the anode current must be reduced below the holding current, as by reverse biasing the anode or diverting anode current away from the junctions.

Four-region PNPN switching devices of the foregoing character, though useful in a variety of circuit applications, have certain undesirable characteristics. First, the switching voltage which must be applied between anode and cathode in order to turn the device on or switch it to its low impedance state is determined as that value of voltage for which the product of the betas equals or exceeds unity. Because the beta for each analogue transistor portion is a non-linear function of current and of applied voltage, and especially temperature, it is difficult to predict accurately or control closely the desired switching voltage or the stability of the switching voltage. Second, it is extremely difficult to produce devices wherein the switching voltages have desirably low values such as, for example, ten volts or less. Third, it is difficult to produce such devices having uniform and desirably low switching currents such as currents of 100 microamperes or less. Fourth, the temperature sensitivity of the various parameters is objectionably large.

Accordingly, one object of the present invention is to provide an improved semiconductor switching device of the foregoing general character having good reproducibility and close tolerances on switching voltage.

Another object is to provide such a device whose switching is voltage responsive, and which switches responsive to low applied voltages of, for example, six to ten volts.

Another object is to provide such a device having a switching voltage which is extremely insensitive to temperature changes of the semiconductor material.

Another object is to provide such a device which is desirably insensitive to the rate of rise of applied voltage, and which is switchable at low currents such as 100 microamperes.

Another object is to provide such a device which can be fabricated using conventional photolithographic and oxide masking techniques, and relatively few impurity diffusion steps.

Another object is to provide such a device which can be readily fabricated with either unilateral or bilateral switching capability.

Briefly, in accordance with the present invention, I provide a switching device of the foregoing character in which the switching voltage is controlled by a reverse-biased control diode connected across, i.e. in parallel with, the center junction, so that the switching voltage is controlled exclusively by the breakdown voltage of the control diode rather than by regenerative feedback involving the betas of the two-transistor analogue portions of the four-region device. Additionally, such device is provided with shunting resistance across the emitter junction of either or both of its transistor analogue portions, which resistance controls the current required through the control diode to switch the switching device to its low impedance state.

Referring to the drawings:

FIGURE 12 is a graph exemplary of the voltage current characteristics of the devices of FIGURES 5, 6 and 8;

FIGURE 13 is a schematic block diagram of a two-electrode bilateral semiconductor switching device constructed according to the present invention;

FIGURE 14 is a fragmentary sectional view of a planar passivated embodiment of the switching device of FIGURE 13, constructed according to the present invention; and FIGURE 15 is a graph of the voltage-current characteristics of the devices of FIGURES 13 and 14.

Figure 1:
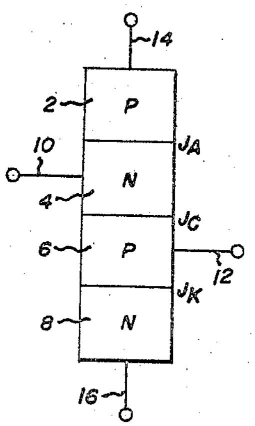
FIGURE 1 shows a schematic diagram of a four-region three-junction PNPN semiconductor switching device of the prior art.
Figure 2:
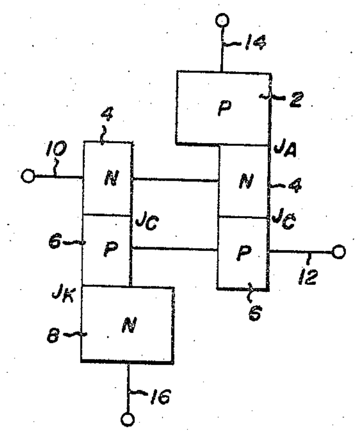
FIGURE 2 shows a block diagram of a two-transistor analogue of the device of FIGURE 1.
Figure 3:
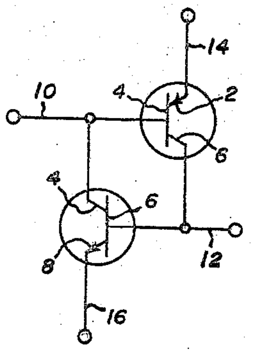
FIGURE 3 shows a schematic circuit diagram of the two-transistor analogue of FIGURE 2 including the positive feedback interconnection of the two transistor portions.

The prior art device of FIGURE 1 includes an anode 2, anode gate 4, cathode gate 6 and cathode 8. In the embodiment shown, the anode 2 and cathode gate 6 are of P-type conductivity and the anode gate 4 and cathode 8 are of N-type conductivity, although the same type of operation as will hereinafter be described could be obtained with relative conductivity types reversed. The interface between anode and anode gate constitutes an anode PN junction $J_A$ while the interface between cathode and cathode gate constitutes a cathode PN junction $J_K$. The interface between anode gate 4 and cathode gate 6 constitutes a center or collector PN junction $J_C$. For an understanding of the operation of the device in terms of its two-transistor analogue, the anode, anode gate, and cathode gate may be construed as a PNP transistor and the anode gate, cathode gate and cathode may be construed as an NPN transistor as shown in FIGURES 2 and 3, the junction $J_C$ being the collector junction of both transistors. The two transistor analogue portions, as shown, operate as though connected in positive feedback configuration such that the collector current of the PNP transistor provides the base drive for the NPN transistor, and the collector current of the NPN transistor provides the base drive for the PNP transistor.

As is well understood in the art, such devices as shown in FIGURES 1 through 3 have a useful switching characteristic responsive to control signals applied, for example, to additional anode gate electrode 10 or cathode gate electrode 12. The conditions for turning on the device for a particular voltage applied across the main current carrying electrodes, i.e. between anode electrode 14 and cathode electrode 16, can be fulfilled by the application of a sufficient turn-on current to one or the other of the separate control electrodes 10, 12.

Figure 4:
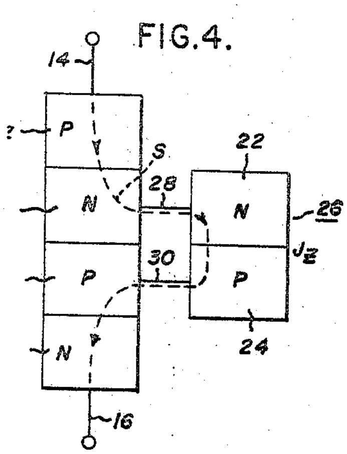
FIGURE 4 shows a schematic block diagram of one form of two-electrode semiconductor switching device constructed in accordance with the present invention.

The device shown schematically in FIGURE 4, in accordance with the present invention, includes four regions similar to those of FIGURE 1, plus an N-type conductivity region 22 and a P-type conductivity region 24 having an interface forming a control PN junction $J_Z$ and constituting a control diode 26. The N-type region of the control diode 26 has a non-rectifying connection 28 to the anode gate region 4 and the P-type region of the control diode has a non-rectifying connection 30 to the cathode gate region 6. When the anode 2 is provided with a potential positive with respect to the cathode 8 and of sufficient magnitude to exceed the breakdown voltage of the control diode 26, current passes along a path shown substantially by dashed line S through anode junction $J_A$, control junction $J_Z$ and cathode junction $J_K$. The control diode is provided with a sharp-kneed voltage-current breakdown characteristic, so that once breakdown occurs, the diode presents a very low impedance and substantial current can flow through the diode with practically no increase in voltage across it. Breakdown of diode 26 thus provides enough current through junctions $J_A$ and $J_K$ to raise the product of the two transistor betas, $h_{fe_2}$ and $h_{fe_1}$, to a value equal to or exceeding unity, thereby turning the device ON and switching it to a state of low impedance between anode 14 and cathode 16. Once on, the device stays on so long as there is sufficient current for the product of the transistor betas to equal or exceed unity.

Since the control diode 26 can readily be made, as will be recognized by those skilled in the art, to have a closely controllable predetermined breakdown voltage, it will be appreciated that "firing" or switching of the device from its high impedance to its low impedance state is voltage responsive, and can be made to occur at a closely controllable predetermined voltage. Moreover, firing of the device can thus be obtained at desirably low voltages of 10 volts or less, as predetermined by the breakdown voltage of the control diode, and without need of any gate electrode signal.

As will be evident from a consideration of the device of FIGURE 4, the switching voltage required to turn the device ON is the sum of the control diode reverse current breakdown voltage and the forward voltage of the two diodes formed by junctions $J_A$ and $J_K$. The breakdown voltage of control junction $J_Z$ should be less than that of control junction $J_C$ to insure that the switching voltage of the device will be controlled exclusively by the characteristics of the control diode. Once the device switches on, of course, the potential across the control diode drops to less than that required to keep the control diode in conduction and hence the control diode acts like an open circuit. The effect of this dropping out of the control diode from the circuit is that the holding current, which continues to flow through junction $J_C$, is larger than the original switching current which flowed through junction $J_Z$.

An additional highly advantageous feature of the structure shown is that the breakdown voltage of the control diode may be provided, in accordance with design and fabrication techniques known in the art for such diodes, with a desired temperature coefficient. As is well known to those skilled in the art, the temperature coefficient of such control diode has a known relation to its designed breakdown voltage. Such temperature coefficient can thus be chosen, if desired, to offset or counterbalance, either completely or to any desired degree, the particular temperature coefficients of forward voltage drop of the forwardly-biased diodes formed at junctions $J_A$ and $J_K$. For example, when silicon is the material employed for the control diode and the four regions 2, 4, 6, 8 of FIGURE 4, a desired positive voltage temperature coefficient for the control diode, sufficient to balance the negative coefficients of the forward-biased diodes formed by junctions $J_A$ and $J_K$, may be easily provided simply by constructing the control diode to have a breakdown voltage of about 7 to 10 volts. As with the device of FIGURE 1, it will be appreciated that the structure of FIGURE 4, and the other embodiments of the present invention to be described hereinafter, can have conductivity types of all regions reversed from those illustrated without any change in mode of operation, provided of course the polarity of applied voltage is correspondingly reversed.

Figure 5:
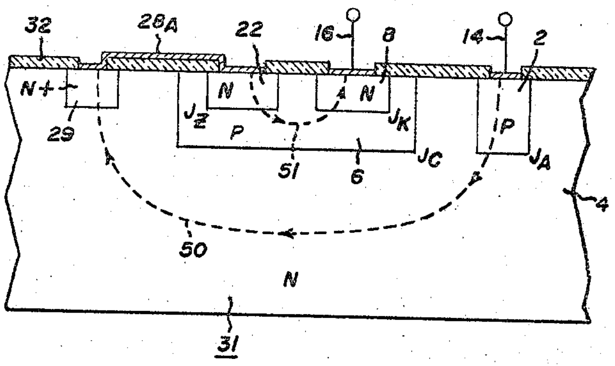
FIGURE 5 shows in fragmentary sectional view, one form of the semiconductor switching device of FIGURE 4, constructed in a planar passivated embodiment according to the present invention.

FIGURE 5 shows a device constructed in accordance with my invention and electrically equivalent to that shown in FIGURE 4 but embodied in a semiconductor pellet of the planar passivated type. The various portions of the structure of FIGURE 5 electrically equivalent to corresponding portions of FIGURE 4 bear the same respective reference characters as used in FIGURE 4. In FIGURE 5 the anode, the anode gate, the cathode and cathode gate regions are combined with the N-region and P region of the control diode in a single integrated body or pellet 31 of suitable single crystal semiconductor material such as silicon. All of the junctions $J_A$, $J_K$, $J_C$, $J_Z$ terminate at the top surface of the pellet and are permanently covered by a suitable masking layer 32 of, for example, silicon dioxide. The pellet may be fabricated by known photolithographic and silicon dioxide masking techniques, as taught, for example, in U.S. Patent 3,122,817 to Andrus and U.S. Patent 2,858,489 to Henkels. A conductive path 28A, which may be a layer of a suitable metal such as, for example, aluminum, is formed on top of the mask 32 to connect the N-region 22 of the control diode with the N-type anode gate region 4 at a location 29 in the anode gate region which is provided with a sufficiently strong N-type conductivity to insure a non-rectifying contact between the conductive path 28A and the anode gate region 4.

In the manufacture of the structure shown in FIGURE 5, an N-type single crystal silicon body having a resistivity in the vicinity of, for example, about 1 ohm centimeter, is provided with a suitable surface coating of silicon dioxide, having a thickness of, for example, 10,000 angstroms. The surface coating is thereupon appropriately masked and selectively etched to form windows beneath which the P-type regions 2 and 6 are formed by diffusion therethrough of atoms of a suitable P-type impurity such as boron. Using similar photolithographic and masking techniques, the N-type regions 8 and 22 may be formed, for example, by diffusion therein of atoms of a suitable N-type impurity such as phosphorus.

Again using known masking and metal evaporation techniques, the metal layer 28A providing the conductive path may be deposited on the structure and alloyed in to make a non-rectifying connection with the N-region 22 of the control diode and the N+ contact region 29 of the anode gate. Likewise, suitable metallic electrodes 14 and 16 are provided for the anode region 2 and cathode region 8. A number of such pellets 31 may, in accordance with techniques known in the art, be formed simultaneously in a single undivided wafer which may thereafter be appropriately subdivided into individual pellets. The pellets may then be suitably mounted and packaged in any desired fashion.

Figure 6:
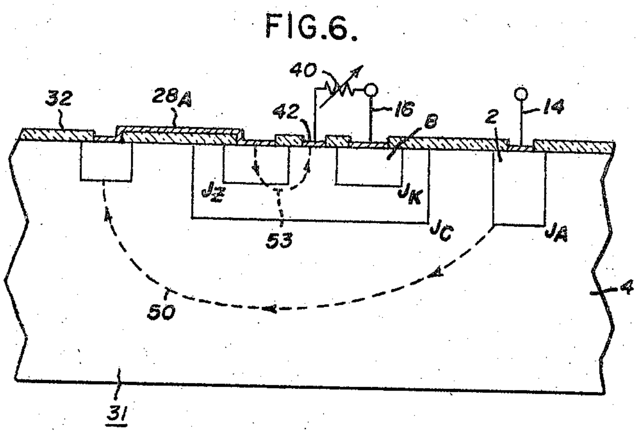
FIGURE 6 is a fragmentary sectional view of another form of semiconductor switching device of the planar passivated type constructed according to the present invention.
Figure 7:
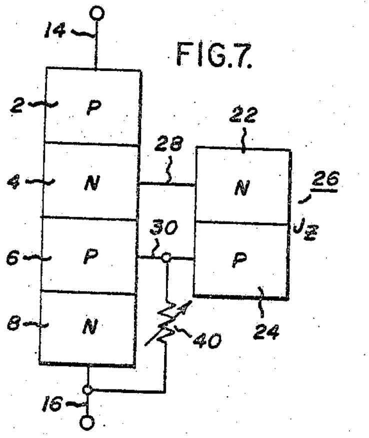
FIGURE 7 is a schematic block diagram of the device of FIGURE 6.

In the device of FIGURE 5, when the breakdown voltage of the control junction $J_Z$ is exceeded a current will flow in the portion of the cathode gate region 6 between the junction $J_Z$ and the cathode region 8, as represented by dotted lines 50 and 51. When sufficient current flow through junction $J_K$ occurs so that the product of the betas of the two analogue transistors constituted by regions 2, 4, 6 and 8 is equal to or greater than unity, the PNPN device will turn on and switch to its low impedance state.

Where more precise predetermination of the amount of switching current required to switch the device to its low impedance state is desired, a switching-current control resistance may be provided in shunt with either junction $J_A$ or junction $J_K$, or both, to automatically generate an internal bias potential for forward biasing one or both of these junctions responsive to flow of a desired switching current into the anode. One example of such an alternative structure is shown in FIGURE 6, where such switching-current control resistance is provided in shunt with junction $J_K$. The device of FIGURE 6 is similar in all respects to that of FIGURE 5 except for the addition of the switching current control resistor 40 connected between the cathode electrode 16 and an ohmic contact 42 to cathode gate region 6. This resistor 40 may be formed directly in pellet 31 by known techniques such as those conventionally used in making monolithic integrated circuits, or may be a thin film or other type of integrated or non-integrated fixed or variable resistor. A schematic diagram of the structure of FIGURE 6 is shown in FIGURE 7, in a manner similar to that of FIGURE 4. In operation of the structure of FIGURE 6, after breakdown of the control junction $J_Z$, the current into the cathode gate region 6 flows to the cathode electrode 16 through the resistance 40, as represented by dotted lines 50 and 53. The product of the resistance 40 and the current flow through it creates an elevated potential in the cathode gate region 6 relative to cathode region 8, which forward biases junction $J_K$ and initiates sufficient current flow through junction $J_K$ to raise the product of the transistor analogue betas above unity and switch the device on to its low impedance state. The size of resistance 40 determines the minimum amount of current flowing through it needed to sufficiently forward bias junction $J_K$ for the regenerative action required to switch the device to its low impedance state. Thus the size of this cathode junction shunting resistance 40 determines the minimum anode current firing characteristics of the device.

As previously explained, resistor 40 may alternatively be connected across junction $J_A$, in which case $J_A$, becomes forward biased responsive to flow of sufficient switching current through resistor 40, and the device switches to its low impedance state when the product of the transistor analogue betas exceeds unity. As still another alternative, not shown, resistors such as 40 may be shunted across both junctions $J_A$ and $J_K$, to give an added measure of flexibility to control of switching current.

Figure 8:
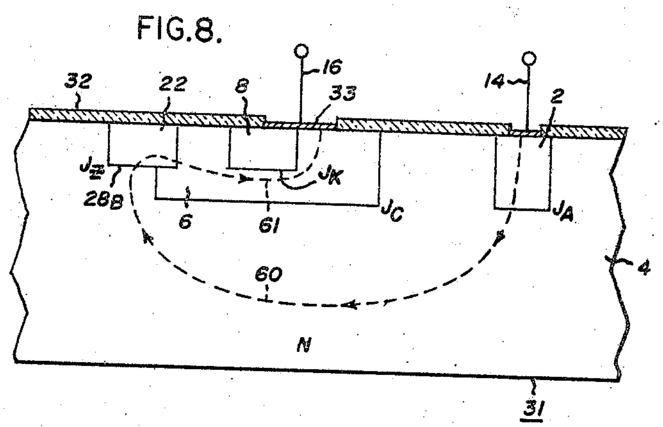
FIGURE 8 is a fragmentary sectional view of still another form of semiconductor switching device of the planar passivated type constructed according to the present invention.

FIGURE 8 shows another embodiment of semiconductor switching device constructed according to my invention. As will be evident from FIGURE 8, the N-region 22 of the control diode makes non-rectifying contact with the N-region of the anode gate 4 directly at interface 28B, thus eliminating the external conductive path 28A of FIGURE 5. Also, the function of resistor 40 in forward biasing junction $J_K$ is performed internally by the inherent resistance of a portion of the cathode gate 6, thus eliminating need for a separate resistor 40. This is accomplished by providing for the current path between the cathode gate 6 and cathode 8 to be partially shunted by a metallic contact layer 33 which is situated so as to contact cathode gate 6 at a location on the remote side of cathode 8 from the junction $J_Z$. With anode 2 positive relative to cathode 4, flow of current, after breakdown voltage of junction $J_Z$ is exceeded but before the device switches to the low impedance state, is represented by dotted line 60 between anode 2 and junction $J_Z$, and by dotted line 61 between junction $J_Z$ and cathode 8. The shunting contact 33 facilitates initial flow of current from junction $J_Z$ to cathode 8, and establishes the path of this current directly through a portion of the cathode gate region 6 adjacent junction $J_K$. The length of path 61, and its effective resistance to such current flow in cathode gate 6 is determined by the relative locations, dimensions, diffusion depths, and diffusion impurity concentration profiles of the regions 6, 8 and 22, and contact 33. Like the current flow through resistor 40 of FIGURE 5B, the current flow through cathode gate 6 from junction $J_Z$ to contact 33 elevates the potential in cathode gate 6 and forward biases junction $J_K$, thereby permitting current flow through junction $J_K$ to commence and initiate the current regeneration process which turns the device ON. Like the size of resistor 40, the amount of resistance of path 61 determines the minimum current needed to forward bias junction $J_K$ and initiate switching. Relative to the structure of FIGURE 6, the structure of FIGURE 8 enables a reduction in the overall size of the semiconductor pellet 31 for a given forward current carrying ability, and has the further advantage that the size of the cathode junction biasing resistance portion of cathode gate 6 can be precisely conrolled by the relative location, lateral dimensions, diffusion depths and resistivities of regions 6, 8 and 22, and contact 33.

FIGURE 12 shows a graph of the voltage versus current characteristics of devices such as shown in FIGURES 5, 6 and 8 with current from anode 2 to cathode 8 being plotted as the ordinate against voltage by which the anode exceeds the cathode as the abscissa. It will be evident from FIGURE 12 that such devices exhibit a unilateral switching characteristic, that is, they turn ON responsive to positive switching potential being applied to anode 2, but will not conduct in the reverse direction without application of the comparatively large reverse voltage required to break down junctions $J_K$ and $J_A$. In actual devices constructed in accordance with FIGURE 8, and having a PNP transistor beta of about .05 to 0.5, and an NPN transistor beta of about 20 to 100, switching voltages of about 6 to 10 volts were obtained, with anode currents required to produce switching being in the range of about 60 to 250 microamperes, and the switching operation was remarkably insensitive to temperature, varying only about .01% per degree centrigrade over a temperature range from −50° C. to +150° C. Holding current was about 500 microamperes, with a forward voltage drop from anode to cathode of about 1.5 volts at 200 milliamperes anode current. The typical value of reverse breakdown voltage, that is, the voltage applied such that the anode is negative and the cathode is positive, was 50 volts.

Once the devices of FIGURES 5, 6 and 8 have turned ON, the major current flow is no longer through the control diode and across junction $J_Z$ but direct from the anode 2 to the anode gate 4 and thence to the cathode gate 6 and cathode 8, with the voltage across the control diode falling to less than the control diode breaker voltage so that the control diode effectively drops out of the circuit. Thus the current flow mechanism in the device changes as the device switches ON. This accounts for the difference in switching current and holding current as illustrated by the graph of FIGURE 12.

Switching devices of the type above disclosed may be used in various applications in which prior art PNPN switching devices are used. For example, it will be evident that they may be used with particular suitability in cross point switching such as in telephone switchboard applications, in oscillators, counting circuits, circuits requiring negative resistance characteristics, firing circuits for semiconductor controlled rectifiers, as well as in a variety of other advantageous applications.

Figure 9:
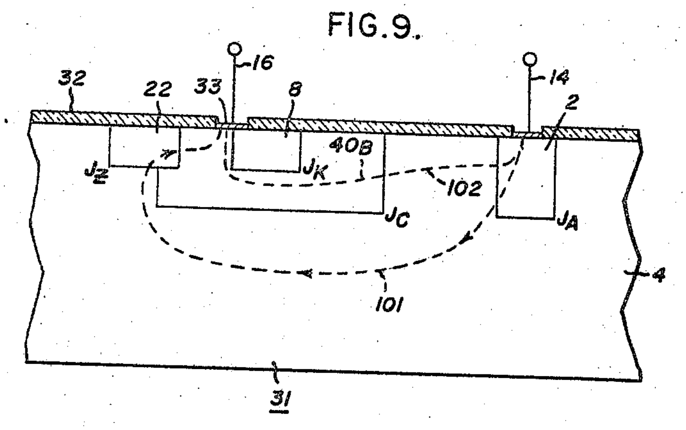
FIGURE 9 is a view similar to FIGURE 8 of still another embodiment of the present invention.
Figure 10:
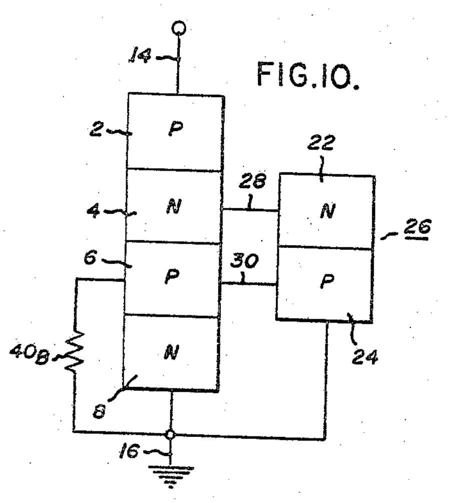
FIGURE 10 is a schematic block diagram of the structure of FIGURE 9.
Figure 11:
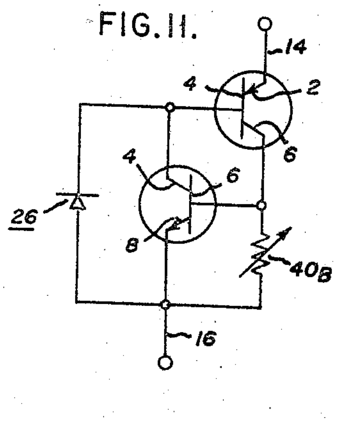
FIGURE 11 is a schematic circuit diagram of the structure of FIGURE 9.

The structure of FIGURE 9 is similar to that of FIGURE 8 except that the cathode gate-to-cathode shunting contact 33 is on the side of the cathode region 8 adjacent the control diode junction $J_Z$, rather than remote from junction $J_Z$ as in FIGURE 8. A schematic block diagram of the structure of FIGURE 9 is shown in FIGURE 10, and its schematic circuit diagram is shown in FIGURE 11. In the operation of this structure after breakdown of the control diode junction $J_Z$, the current from the anode across the control diode junction $J_Z$ flows directly to the cathode electrode 16 as shown by dotted line 101. However, the flow of this current across junction $J_A$ creates by transistor action some current flow across collector junction $J_C$. The amount of this initial current flowing across junction $J_C$ is equal to that flowing across junction $J_A$ multiplied by the beta of the PNP analogue transistor portion of the device. The path of this latter current is represented by dotted line 102 from junction $J_A$ to junction $J_C$, and by dotted line 40B from $J_C$ to $J_K$. As shown, the location of this current path 40B through cathode gate 6 is established by the location of contact 33 to be along junction $J_K$. This current represented by path 40B creates, due to the resistance of the cathode gate region 6 through which it flows, an elevated potential in the cathode gate region 6 sufficient to forward bias junction $J_K$, and thereby initiate turning on of the device to its low impedance state. The cathode gate-to-cathode shunting resistance in the structure of FIGURE 9 is physically provided by that portion of the cathode gate region through which the current path 40B travels, and is shown schematically at 40B in FIGURES 10 and 11. As with the structure of FIGURE 8, the size of resistance 40B determines the initial current required to switch the device ON, and is determined by the relative locations, lateral dimensions, diffusion depths, and resistivities of regions 2, 6, 8, and 22, and contact 33.

FIGURE 14 shows another embodiment of my invention similar to FIGURES 8 and 9, but constructed to provide bilateral switching action, that is, a change from the high impedance to the low impedance state responsive to application of a positive switching potential at either anode 2 or cathode 8. As will be evident from FIGURE 14 and its block schematic equivalent as shown in FIGURE 13, with anode F2 positive with respect to cathode F8, after junction $J_{FZ}$ breaks down but before the device switches to its low impedance state, the current flow path is as represented by dotted line F, from anode electrode F14 through anode F2, anode gate F4, cathode gate F6, to cathode electrode F16. Again with respect to FIGURE 8, with the anode R2 positive with respect to cathode R8, after junction $J_{RZ}$ breaks down but before the device switches to its low impedance state, the current flow path is as represented by dotted line R, from the anode electrode R14, through the anode R8 region to anode gate R4, and then through cathode gate R6 to cathode R8. For current flow from anode F2 to cathode F8, the control diode junction is $J_{FZ}$ and occurs between N-type region F22 and P-type region F24 of cathode gate F6. For current flow from anode R2 to cathode R8, the control diode junction is $J_{RZ}$ and occurs between N-type region R22 and cathode gate R6. The bilateral switching characteristic of the structure of FIGURE 14 is shown in the graph of FIGURE 15 which is similar to the graph of FIGURE 12 except that the bistable characteristic shown in the first quadrant of the graph of FIGURE 12 is repeated in the first quadrant of the graph of FIGURE 15 and finds its complement in the third quadrant of FIGURE 15.

Thus it will be evident that the switching device above described, whether the unilateral embodiments of FIGURES 5, 6, 8, or 9, or the bilateral embodiment of FIGURE 14, have a number of important advantages satisfying a long-felt need in the art. It can be made extremely insensitive to temperature change. It switches at an extremely low, predictable and controllable voltage such as 7 to 10 volts, as determined by the breakover voltage of the control diode 26. It can be switched by a predetermined low switching current such as 60 to 100 microamperes, as determined by the transistor analogue emitter junction biasing resistances 40, 40A and 40B. It is particularly suitable for fabrication, in either unilateral or bilateral form, by conventional photolithographic and masking techniques known in the art and heretofore employed in the fabrication of planar passivated transistors. All the junctions $J_A$, $J_C$, $J_K$ and $J_Z$ may be permanently masked by an oxide or other suitable covering for minimum undesired leakage current, and the device may thus be packaged in either a hermetic container or a low cost plastic encapsulant. It can be conveniently fabricated to provide all of the foregoing desirable characteristics in either the unilateral switching embodiment or the bilateral switching embodiment.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. A planar semiconductor switching device comprising a semiconductor body having a first region of one conductivity type in said body; a first electrode in non-rectifying contact with the first region; a second region of opposite conductivity type in said body; a second electrode in non-rectifying contact with the second region; a first intermediate region of said opposite type between the second region and the first region and forming an anode PN junction with the first region; a second intermediate region of said one type between the first intermediate region and the second region and forming a center PN junction with the first intermediate region and a cathode PN junction with the second region; all of said first, second, first intermediate and second intermediate regions having at least one common surface adjacent to the surface of said body; a control diode having a region of said opposite type and a region of said one type separated by a control PN junction and having at least one surface of said regions of said control diode coplanar with the common surface of said body; means forming a non-rectifying connection between the opposite type region of the control diode and the first intermediate region, and means forming a non-rectifying connection between the one type region of the control diode and the second intermediate region; whereby reverse breakdown of the control junction responsive to the application of voltage between the first electrode and second electrode enables forward current flow from the first electrode across the anode junction and control junction into the second intermediate region.

2. A semiconductor switching device as defined in claim 1, wherein at least one of said first and second electrodes extends into non-rectifying contact with the adjacent intermediate region.

3. A semiconductor switching device as defined in claim 1, wherein the current path between said control junction and at least a particular one of said first and second electrodes is shunted by a switching current control resistance extending between said particular electrode and an intermediate location in said current path.

4. A semiconductor switching device as defined in claim 1 having a switching current control resistance connected in a current path between said control junction and at least a particular one of said first and second electrodes, whereby a potential is generated responsive to current flow in said current path, and means for applying said potential as a forward bias to the PN junction between the region to which said particular electrode is connected and the adjacent intermediate region.

5. A semiconductor switching device as defined in claim 1 wherein the four regions constituted by said first and second regions and said two intermediate regions constitute respective PNP and NPN analogue transistors connected in positive feedback configuration such that when current flows across said anode junction and said cathode junction and the product of the betas or sum of the alphas of said two analogue transistors is not less than unity, the series impedance of said four regions switches from a relatively high value to a relative low value.

6. A semiconductor switching device as defined in claim 1, wherein the breakdown voltages of the control diode junction and the first emitter-base junction which is formed by said first region and said first intermediate region are selected so as to substantially offset the particular temperature coefficients of each other.

7. A semiconductor switching device comprising a body of monocrystalline semiconductor material having opposed major faces and having selected impurities therein defining four regions of alternate conductivity type in said body separated by three PN junctions extending to one major face of said body, means for making electrical contact to said cathode region, an additional region of a single conductivity type inset into the two central regions of said four regions and extending across the center of said three PN junctions, said additional region forming a control PN junction spaced from said center junction with one of said two central regions which is reverse biased when the center junction is reverse biased, said control PN junction having a reverse bias breakdown voltage lower than that of said center junction, a first electrode making non-rectifying contact to said one of said two central regions and with the adjacent endmost region of said four regions, and a second electrode in non-rectifying contact with the other of said endmost regions.

8. A semiconductor switching device comprising a body of silicon monocrystalline semiconductor material having opposed major faces, a layer of silicon oxide on one major face of said body, a series of four regions in said body extending to said one major face of said body, adjacent regions of said series being of opposite conductivity and forming three respective PN junctions which terminate entirely beneath said oxide layer at said one major face of said body, said four regions consisting of an anode region of one conductivity type, an anode gate region of opposite conductivity type adjacent said anode, a cathode gate region of said one conductivity type adjacent said anode gate region, and a cathode region of said opposite conductivity type adjacent said cathode gate region, means for making electrical contact to said cathode region, a control diode in said body including an additional region of a single conductivity type inset into the two central regions of said four regions and extending across the center of said three PN junctions, said additional region forming a control PN junction with one of said two central regions which is spaced from said center junction and reverse biased when the center junction is reverse biased, said control PN junction having a reverse bias breakdown voltage lower than that of said center junction, a first electrode in non-rectifying contact with said one of said two central regions and with the adjacent endmost region of said four regions, and a second electrode in non-rectifying contact with the other of said endmost regions.

9. A semiconductor switching device comprising a body of semiconductor material having a P-type anode region and an N-type cathode region, an N-type anode gate region in said body between the cathode region and the anode region and forming an anode PN junction with the anode region, a P-type cathode gate region in said body between the anode gate region and the cathode region and forming a center PN junction with the anode gate region and a cathode PN junction with the cathode region, a control diode N region in said body in non-rectifying contact with the anode gate region, a control diode P region in said body in non-rectifying contact with the cathode gate region and separated by a control PN junction from the control diode N region, an anode electrode in non-rectifying contact with the anode region, a cathode electrode in non-rectifying contact with the cathode region, said cathode electrode having an extension in non-rectifying contact with said cathode gate region.

10. A semiconductor switching device comprising a body of semiconductor material having a P-type anode region and an N-type cathode region, an N-type anode gate region in said body between the cathode region and the anode region and forming an anode PN junction with the anode region, a P-type cathode gate region in said body between the anode gate region and the cathode region and forming a center PN junction with the anode gate region and a cathode PN junction with the cathode region, a control diode N region, a control diode P region separated by a control PN junction from the control diode N region, means forming a non-rectifying connection between the N region of the control diode and the anode gate region, means forming a non-rectifying connection between the P region of the control diode and the cathode gate region, an anode electrode in non-rectifying contact with the anode region, a cathode electrode in non-rectifying contact with the cathode region, said cathode electrode having an extension in non-rectifying contact with said cathode gate region, and a cathode junction biasing resistance in the path of current flow in said cathode gate region to said cathode electrode extension, whereby application of control junction breakdown voltage between the anode electrode and cathode electrode initiates current flow across the anode junction and control junction and forward biases the cathode junction.

11. A semiconductor switching device comprising a monocrystalline body of semiconductor material having selected impurities therein defining four regions of PNPN conductivity type arrangement, at least three adjacent regions of said body constituting an analogue transistor having a high current gain, a PN junction control diode connected in parallel with the two central regions of said four regions, at least two non-rectifying contacts engaging said body with at least one of said contacts in electrical connection to both a P and an N region thereof for electrically shunting the PN junction therebetween whereby the application of an increasing voltage across said analogue transistor of such polarity as to reverse bias the center PN junction of said four regions produces only a low current conduction therethrough to the point of reverse voltage breakdown of said control diode and whereby current flowing through the region between said center junction and said shorting contact produces a forward biasing of the electrically shorted junction to cause conduction through all four regions.

12. A semiconductor switching device comprising a body of semiconductor material having selected impurities therein defining five regions of alternate conductivity type with adjacent regions separated by PN junctions, a first PN junction control diode connected in parallel across the PN junction between the middle region and one penultimate region, a second PN junction control diode connected in parallel across the PN junction between the middle region and the other penultimate region, a first contact making non-rectifying connection with one endmost region, a second contact making non-rectifying connection with the other endmost region, a first switching current control resistance connected in a current path between said first control diode and one of said contacts, and a second switching current control resistance connected in a current path between said second control diode and the other of said contacts.

13. A semiconductor switching device comprising a body of semiconductor material having selected impurities therein defining five regions of alternate conductivity type with adjacent regions separated by PN junctions, a first PN junction control diode connected in parallel across the PN junction between the middle region and one penultimate region, a second PN junction control diode connected in parallel across the PN junction between the middle region and the other penultimate region, a first contact making non-rectifying connection with one endmost region of said five regions and the adjacent penultimate region, and a second contact making non-rectifying connection with the other endmost region of said five regions and the adjacent penultimate region.

References Cited

UNITED STATES PATENTS

| | | | |
|---|---|---|---|
| 2,981,877 | 4/1961 | Noyce | 317—235 |
| 3,199,002 | 8/1965 | Martin | 317—235 |
| 3,236,698 | 2/1966 | Shockley | 317—235 |
| 3,256,587 | 6/1966 | Hangstefer | 317—235 |
| 3,275,846 | 9/1966 | Bailey. | |

JAMES D. KALLAM, *Primary Examiner.*

U.S. Cl. X.R.

317—234